Sept. 18, 1973 F. J. BARONE ET AL 3,759,762

METHOD OF FORMING INTEGRATED CIRCUITS UTILIZING LOW RESISTANCE VALUES, LOW TEMPERATURE DEPOSITED OXIDES AND SHALLOW JUNCTIONS

Filed Oct. 19, 1970 2 Sheets-Sheet 1

INVENTOR.
Frank J. Barone
Donald L. Tolliver

BY *Mueller & Aichele*

ATTORNEYS

INVENTOR.
Frank J. Barone
BY Donald L. Tolliver
Mueller & Aichele
ATTORNEYS 3,759,762

METHOD OF FORMING INTEGRATED CIRCUITS UTILIZING LOW RESISTANCE VALUES, LOW TEMPERATURE DEPOSITED OXIDES AND SHALLOW JUNCTIONS

Frank J. Barone, Tempe, and Donald L. Tolliver, Phoenix, Ariz., assignors to Motorola, Inc., Franklin Park, Ill.

Filed Oct. 19, 1970, Ser. No. 81,734
Int. Cl. H01l 7/34
U.S. Cl. 148—187 14 Claims

ABSTRACT OF THE DISCLOSURE

A semiconductor structure is described wherein integrally formed resistors are employed having a preferred resistance value of approximately 50 ohms per square. Additionally, processing is compatible with this low resistance value and includes low temperature deposition of passivating layers, improved cleaning and annealing cycles.

BACKGROUND OF THE INVENTION

This invention relates to the fabrication of semiconductor devices using low temperature deposition of passivation layers and, more particularly, relates to the fabrication of shallow junction devices employing diffusions of less than 1.0 micron, diffused resistance elements of less than 150 ohms per square and a multilayered passivation layer including phosphorus doped silicon dioxide.

In the manufacture of semiconductor devices in general and shallow junction integrated circuits in particular, several problems arise when such structures are fabricated using existing procedures. The manufacture of low sheet resistance, or high conductivity resistance elements is complicated by many factors. A first of such factors is that boron is a conductivity type determining impurity which is used to fabricate the resistance elements. The level of concentration determines the sheet resistance and as the level of impurity concentration increases, the sheet resistance decreases. The fabrication of the high concentration resistance elements is not the last step in the manufacture of semiconductor structures and, in fact, it is common to form at least one if not a plurality of passivating layers, individually or in combination, atop a semiconductor substrate which contains a boron diffused resistance element.

For keeping the resistance values of the resistance elements on shallow junction structures within a repeatable and predictable range, it has been found that relatively low temperatures are preferable for forming the passivating layers. When higher temperatures are employed, the boron outdiffuses into the passivating layers from the semiconductor substrate, reducing the impurity concentration and increasing the resistance values. Although the semiconductor structure could operate in some manner with the new value of its resistance elements, it is rejected for not meeting its design specifications. These problems are emphasized for resistance values lower than 50 ohms per square. The temperature is kept within a range of 400° C. to 500° C. for best results and a temperature range between 425° C. to 450° C. is preferred.

The base region of an active semiconductor device fabricated in conjunction with the above mentioned resistance element, is conveniently formed by a boron diffusion. Although the resistance value of the base region is greater than the resistance value of the resistance element, the fabrication of both areas includes the formation of a boron oxide layer on the side of the substrate from which the diffusion is made. In other words, the boron oxide layer is automatically formed during the boron diffusion.

The boron oxide layer must be removed because its presence is incompatible with an emitter wash out procedure used in practicing another aspect of the present invention and more fully described by C. F. Myers in his U.S. patent application entitled "High Speed Shallow Junction Semiconductor Device and Method of Making Same," filed Apr. 3, 1969, Ser. No. 813,105, and assigned to the assignee of the present invention.

The stripping of this boron oxide layer from the substrate surface including the base collector junction is a critical step because this junction is an active junction in the final transistor and its contamination by physical contaminants, which are in the atmosphere or ambient, or electrical contaminants, such as excess charge, must be avoided.

More specifically, the collector resistivity is in the order of 0.3 ohm centimeters, making it susceptible to surface charge which degrades the operating characteristics of the device. It is desired that the total amount of charge left on the surface is zero giving a neutral surface charge. An excess of negative charge at the interface with the passivating layer channels the N-type collector, while too much positive charge at the interface with the passivating layer channels the base.

The stability of the semiconductor device including its interface charge is established for the expected lifetime of the semiconductor structure by an annealing cycle. However, the use of an excessive annealing temperature causes outdiffusions of the boron impurities from the resistance elements. Accordingly, the present invention contemplates an annealing cycle which complements the formation of the resistance elements, and the formation of the low temperature oxide layers.

Prior art techniques do not permit the fabrication of devices having junctions under 1 micron, with resistance values of resistance elements under 150 ohms per square. According to a typical prior art technique, thermal oxide is grown over the resistor and base regions. Once the thermal oxide reaches a predetermined thickness, an emitter window is opened for emitter diffusion. This thermal oxidation procedure prevents maintaining the base and resistor values within specified limits because the relatively high temperature required for thermal growth causes outdiffusion from the above-mentioned base and resistor areas causing an increase in resistance values.

According to a second typical prior art technique, an emitter diffusion comprises phosphorus as the conductivity type determining impurity. When an emitter depth of 0.5 micron for example is desired, the diffusion of phosphorus through an emitter aperture to form an emitter junction at a depth of only 0.5 micron forms a phosphorus doped silicon dioxide layer of only 500 angstroms or less in thickness. This phosphorus doped silicon dioxide is formed in the diffusion aperture. The well known requirements for employing a phosphorus oxide layer as an insulating and stabilizing layer contemplates a layer having a thickness between 2,000 and 3,000 angstroms. Accordingly, using the phosphorus diffusion techniques of the prior art it is not possible to combine shallow junction of under 1 micron with a phosphorus doped emitter oxide layer greater than 500 A.

When the prior art is followed and a layer of 2,000 to 3,000 angstroms of phosphorus doped oxide is formed over the substrate and the substrate includes a base region, the prior art teaches the use of the conventional photoresist process which includes forming an emitter mask, and etching or otherwise forming a first emitter aperture and secondly reopening a portion of the emitter region for forming a metallized contact to the emitter region.

This procedure cannot conventionally be utilized to form an initial emitter aperture having a width under 3.0 microns. Hence, the emitter wash out procedure described in the aforementioned U.S. patent application is followed to avoid a reopening within the emitter aperture for making an electrical connection to the emitter region. The present invention specifies a new and novel technique for accomplishing emitter wash out.

SUMMARY OF THE INVENTION

The present invention relates to semiconductor devices including integrated circuits and, more particularly, it relates to such devices and their fabrication for forming relatively high frequency, low power devices.

It is an object of the present invention to provide a semiconductor device having a relatively high frequency of operation and low power consumption.

It is another object of the present invention to provide a semiconductor device utilizing relatively low resistance values for the resistance elements integrally formed with other active semiconductor devices.

A further object of the present invention is to provide a semiconductor device utilizing relatively low resistance values for resistance elements in combination with low temperature deposition of passivating layers.

A still further object of the present invention is to provide a cleaning process for use with a semiconductor substrate for assuring good adherence of low temperature oxide depositions on such substrate.

Another object of the present invention is to provide a semiconductor device utilizing relatively low resistance values for the resistance elements integrally formed with other active semiconductor elements and to deposit low temperature passivating layers on the resulting structure followed by an annealing step for assuring highly stable semiconductor devices.

These and other objects and features of this invention will become fully apparent in the following description of the accompanying drawings, wherein.

BRIEF DESCRIPTION OF THE INVENTION

The present invention contemplates the combination of supplying a semiconductor body of one conductivity type and forming doped areas in a major surface of the body, which areas comprise an impurity concentration in the range of $1\times10^{-19}$ atoms/cc. to $5\times10^{-20}$ atoms/cc. therein, one use of which is a resistance element, another use is as a base element; cleaning such major surface to achieve a neutral interface charge; forming low temperature passivating layers on the major surface covering the doped areas; diffusing a further region into certain of said doped areas; and annealing said composite structure for densifying said passivating layers and for stabilizing the electrical characteristics of said composite structure.

DETAILED DESCRIPTION OF THE DRAWINGS

Figure 1:
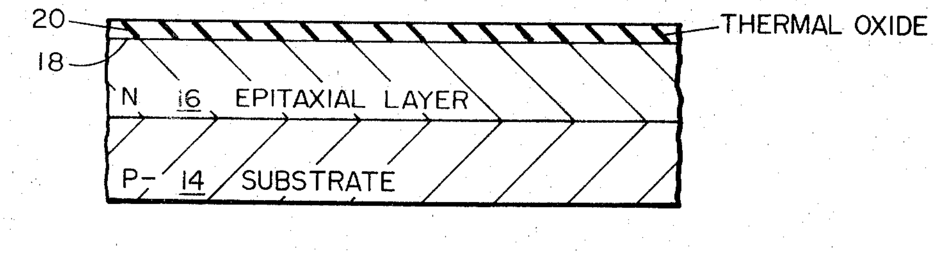
FIG. 1 shows a semiconductor substrate formed with an epitaxial layer and first thermal oxide layer.

Referring to FIG. 1, there can be seen a starting body of semiconductor material 14 having an epitaxial layer 16 formed thereon and formed with a major surface 18. The body of semiconductor material can be of any well known type including silicon germanium, gallium arsenide, etc. However, for the purpose of this description silicon is chosen. The substrate 14 can be of either P type or N type conductivity and for convenience P type is illustrated. A thermal oxide insulating layer 20 is formed on the major surface 18. The function of this layer is to passivate the surface 18 and hence any well known passivating layer can be used. Silicon dioxide is shown for convenience.

Figure 2:
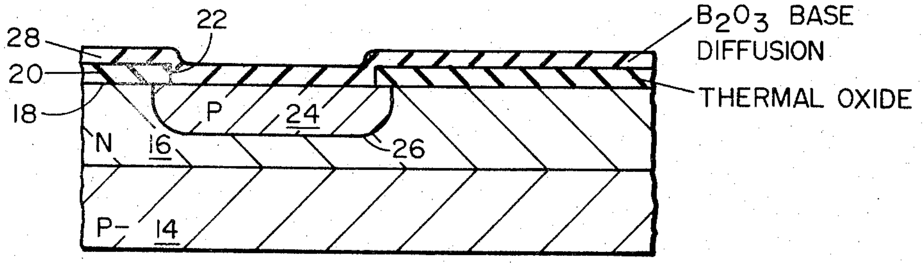
FIG. 2 shows the formation of the shallow junction base region and an additional layer of boron doped thermal oxide.

Referring to FIG. 2, there is shown the formation of a base aperture 22. A boron diffusion is performed at 950° C. and an impurity concentration between the ranges of $1\times10^{19}$ atoms/cc. and $5\times10^{19}$ atoms/cc. is formed in a region 24 forming a junction 26 with the layer 16. The junction 26 lies preferably 1 micron under the major surface 18 but could lie between the range of 1.4 microns to .4 micron under the major surface 18. A boron oxide layer 28 is formed in the normal fashion during this diffusion and forms a layer approximately 3,000 angstroms thick. The base region 24 is formed at this time because the resistance value is normally greater than the resistance value of any region to be formed thereafter and is normally above the range of 150 ohms per square.

Figure 3:
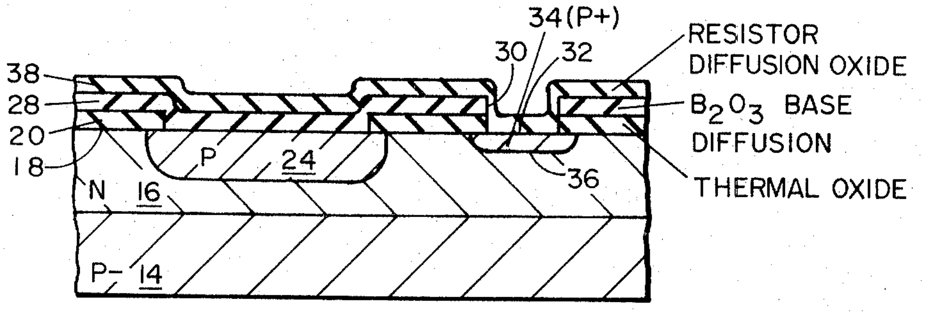
FIG. 3 shows the formation of the shallow junction low resistance value of a resistance element.

Referring to FIG. 3, there is shown a resistor aperture 30 formed through the thermal oxide layer 20 and the boron oxide layer 28 for exposing a surface portion 32 of the surface 18. A second boron diffusion is performed in a temperature range of 950° C. to 1,000° C., preferably at a temperature of 975° C. for 25 minutes. This diffusion contemplates the formation of a region 34 having an impurity concentration level between the ranges of $1\times10^{20}$ atoms/cc. to $5\times10^{20}$ atoms/cc. and preferably at a level of $3\times10^{20}$ atoms/cc. for forming resistors having an initial sheet resistance value of 44 ohms per square and a final value of 50 ohms per square. The region 34 has a junction 36 with the epi layer 16.

The importance of the invention does not lie in the absolute value chosen for the resistance values but rather in the combination of a relatively low resistance value, under 150 ohms per square, and the subsequent steps of low temperature deposition of passivating layers and a final annealing step for stabilizing the charge on the surface 18 and for densifying the insulating layers.

Figure 4:
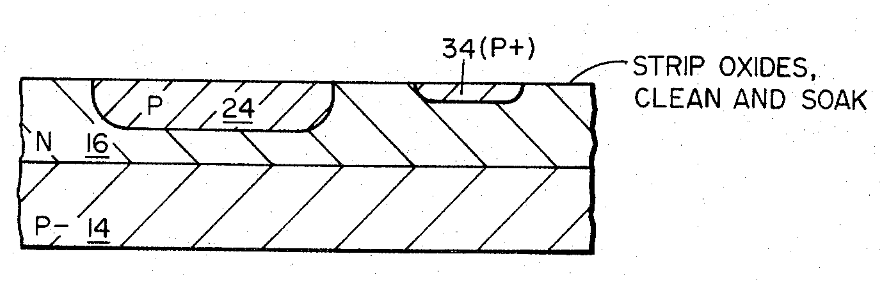
FIG. 4 shows the structure of FIG. 3 after all oxide layers are removed.

During the formation of the region 34, a second boron layer 38 is formed integrally attached and indistinguishable from the layer 28. Referring to FIG. 4, the layers 20, 28 and 38 are removed, leaving the substrate 14, the layer 16 and its regions 24 and 34 formed therein.

Figure 5:
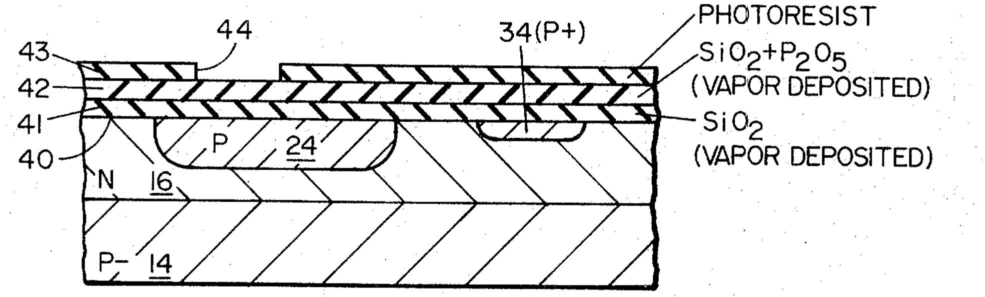
FIG. 5 shows the pyrolytic formation of a first layer of silicon dioxide layer on the composite structure and the formation of a second layer of phosphorus doped silicon dioxide on the first layer.

The cleaning operation is a very critical part of the fabrication process because without proper cleaning operations excessive space charge accumulates on the major surface 18. Although there are many cleaning procedures which operate with the present invention of forming low resistance values of resistance elements, forming low temperature passivating layers and annealing the composite structure, the following cleaning process is preferred for providing the surface 18 with a slight negative charge at the silicon-silicon oxide interface which is best shown in FIG. 5 at 40. The interface 40 resides in the area between the surface 18 and the passivating layers formed thereon. The aforementioned negative charge sets up a small positive space charge region within the layer 16 and just under the surface 18. If the negative interface charge evaluated by capacitance-voltage methods is large enough, a sufficiently high compensating positive charge is created just under the surface and this sub-surface region becomes a channel which degrades the operation of the device by effectively creating a short-circuit over the collector region of the devices. A positive offset between the ranges of +1 to +20 volts has been found suitable and less than 10 preferable, and is achieved by placing the substrate shown in FIG. 4 in a 48% solution of hydrofluoric acid held at room temperature 27° C. for one (1) minute; then rinsing the substrate in de-ionized water for five (5) minutes, keeping the water at room temperature 27° C.; transferring the substrate to a pure nitric acid solution which is boiling and maintaining the boiling for five (5) minutes; returning the substrate to a five (5) minute rinse with de-ionized water kept at room temperature; returning the substrate to a pure chromic acid clean for five (5) minutes where the acid is kept at 100° C. during this portion of the cleans; and finally the substrate is subjected to a final clean in de-ionized water for five (5) minutes keeping the water at room temperature 27° C. Between the above mentioned steps in the cleaning process, the substrate is protected from the atmosphere and ambients.

Since the surface 18 is super-sensitive to exposure and degradation in air, a minimum time lapse is permitted from performing the above cleaning operation before the deposition of two layers, hereinafter described, are formed. However, prior to such formation, the cleaned surface is soaked in acetone to chemically absorb the residual water from the surface 18. The acetone is electronic grade acetone having less than a 5% water content. Acetone is an organic solvent and leaves certain residues on the surface 18 when it evaporates. Pursuant to the preferred process, the acetone is dried off by a stream of nitrogen gas. It is not clearly understood, but apparently the annealing cycle described hereinafter causes any acetone residue to be absorbed into the passivating layers and thereby rendered harmless. As a substitute for the acetone, it has been found that isopropyl alcohol and methyl alcohol render acceptable results.

In FIG. 5, a first low temperature vapor deposited oxide layer 41 is formed, for example, by exposing the epitaxial layer 16 to a gaseous mixture of oxygen and silane at atmospheric pressure and at a relatively low deposition temperature ranging from between approximately 350° C. and 500° C. Preferably, a deposition temperature within the range of 425° C. to 450° C. is used. Next, a layer of a phosphorus doped oxide layer 42 is deposited on the initial low temperature oxide layer 41 by exposing, for example, the oxide layer 41 to a gaseous mixture of silane, phosphine, and oxygen at atmospheric pressure at a relatively low deposition temperature between approximtaely 425° C. and 450° C. The oxide layer 41 may typically be in the order of 5,000 angstroms, and the phosphorus doped oxide layer 38 is typically in the order of 1,500 to 3,000 angstroms, preferably 2,000 angstroms.

Figure 6:
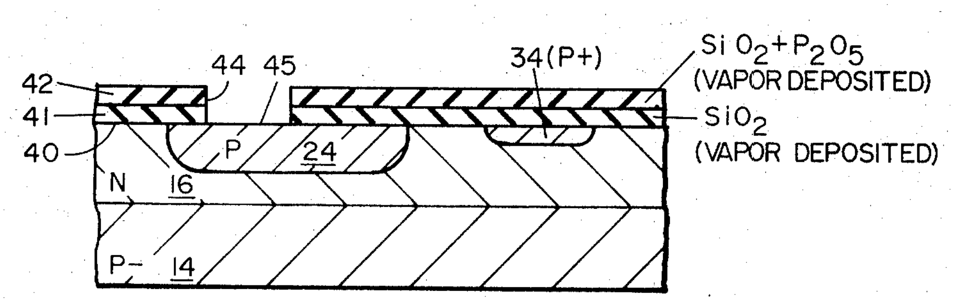
FIG. 6 shows the formation of the emitter aperture.

After the surface oxide layer 41 and the phosphorus doped oxide layer 42 have been deposited to a total thickness of approximately .7 micron, a photoresist mask 43 is formed on the surface of the phosphorus doped oxide layer 42 using known photolithographic techniques. An opening 44 is then formed in the photoresist mask 43, and the oxide exposed by the opening 44 is removed as shown in FIG. 6 by etching the oxide with a suitable oxide etchant such as diluted hydrofluoric acid. When the portion of the oxide exposed by opening 44 is removed to thereby expose a surface area portion 45 of the epitaxial layer 16, the photoresist layer 43 is removed from the upper surface of the phosphorus doped oxide layer 42.

Next, an N type impurity opposite in conductivity to the first or base region 24 is diffused into a portion of region 24 to define a second or emitter region 46 of the transistor being fabricated. Phosphorus is the impurity normally employed for this diffusion process.

Figure 7:
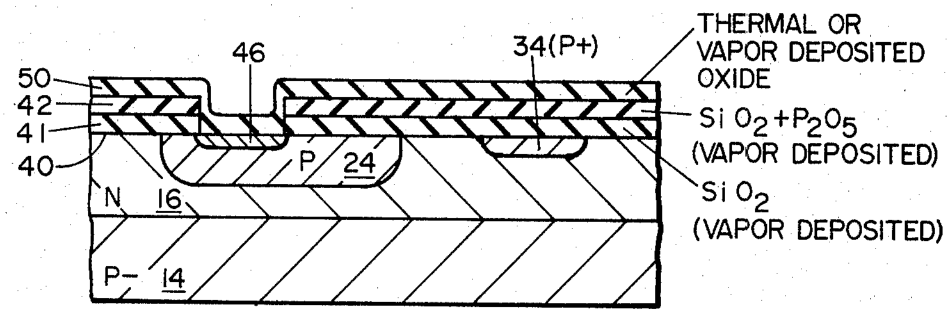
FIG. 7 shows the emitter diffusion (photoresist removed)

The emitter diffusion cycle is also the annealing cycle. The function of the anneal cycle is to densify and stabilize the passivating layer or layers to fix a desired charge density at the interface 40 as previously described. Obviously, many time and temperature combinations can be found for placing this feature of the invention into operation. For example, an acceptable anneal cycle includes temperatures as low as 900° C. for 35 to 40 minutes to 1,000° C. for 1 to 2 minutes. However, it has been found preferable to perform the anneal cycle at 975° C. for fifteen (15) to twenty-five (25) minutes. During the diffusion of the second or emitter region 46 into the semiconductor structure, a thin layer 50, shown in FIG. 7, of phosphorus silicate glass is thermally grown on the surface of the second region 42 and on the exposed surface of oxide layer 42. This thin layer 50 of phosphorus silicate glass of about 350 to 500 angstroms arises from the shallow diffusion depth of the emitter region 46. Such a shallow emitter region is necessary for very high speed switching of transistors and it follows that only 350 to 500 angstroms of phosphorus silicate glass can be grown during this diffusion.

The thin layer of phosphorus silicate glass 50 is now covered by a photoresist mask (not shown), and openings are formed in the photoresist mask using known photoresist etching techniques. These openings expose a triple layer portion of the oxide layers 41, 42 and 50 which are to be removed in a subsequent etching step.

Figure 8:
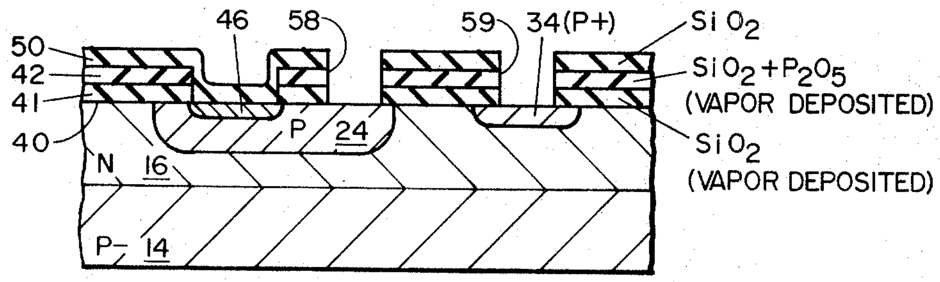
FIG. 8 shows the formation of the pre-ohmic aperture to the base and resistance elements and the thin layer of silicon dioxide covering the emitter.
Figure 9:
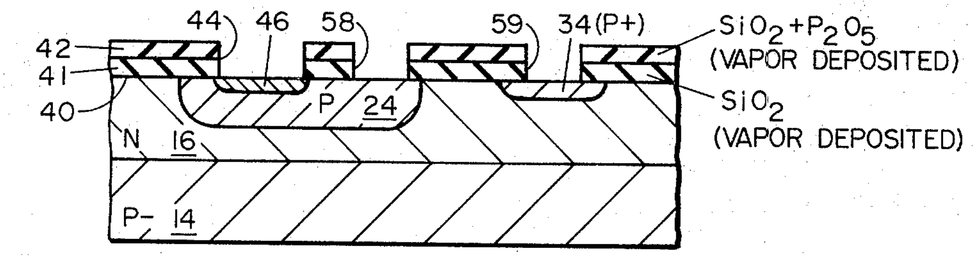
FIG. 9 shows the structure after removal of the thin silicon dioxide layer formed on the emitter by an emitter wash out technique.

By using an oxide etchant such as dilute HF, openings 58 and 59 (FIG. 8) are made; at this step in the present process, all P type regions to be contacted should be exposed by similar etchings of the surface oxide layers 41, 42 and 50. As mentioned above, the transistor and resistor illustrated in the accompanying drawings are intended to represent only two of many active and passive circuit components which may be simultaneously fabricated using the present process in a monolithic integrated circuit. Once the openings 58 and 59 have been made in the oxide layers 41, 42 and 50 as shown in FIG. 8, the photoresist masking pattern is removed using a photoresist removal process. Two typical photoresist removal agents are known in the semiconductor industry as the J–100 and A–20 agents. Then, by controllably etching the thin layer 50 of phosphorus silicate glass, the emitter window 44 established with reference to FIG. 5 may be reopened as shown in FIG. 9 to permit the subsequent deposition of metallization on the emitter surface.

One controlled etching cycle which has been used to remove the thin layer 50 is characterized by the following times, temperatures and materials: Initially, chromic acid is applied to the layer 50 for approximately 5 minutes, followed by a D. I. $H_2O$ rinse. Next, an etchant known in the semiconductor industry as the 1514 etch is applied to the oxide layer 50 for approximately 5 to 10 seconds. The 1514 etch comprises 15 parts of a saturated ammonium fluoride solution, 1 part HF, and 4 parts $H_2O$. This 1514 etchant has an etch rate of approximately 8 to 10 angstroms per second on high temperature thermally grown $SiO_2$. Next, the surface of the structure shown in FIG. 8 is cleaned in a nitric acid bath for approximately 5 minutes, then rinsed in de-ionized water and then etched for 5 more seconds in the 1514 etchant. Finally, the structure in FIG. 8 is again rinsed in ultra pure de-ionized water to complete the transition from the structure shown in FIG. 8 to the structure shown in FIG. 9.

Figure 10:
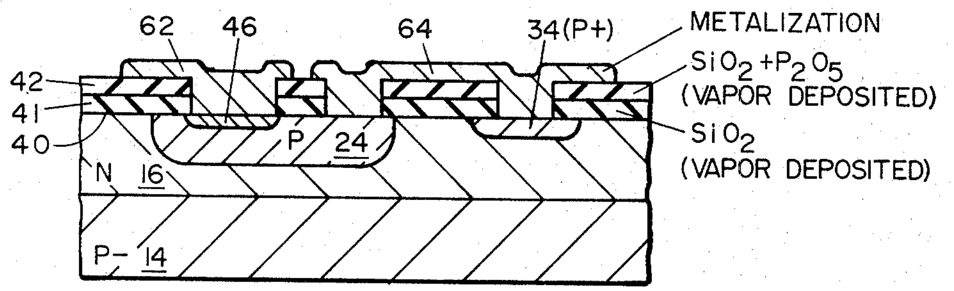
FIG. 10 shows the metallization formed within the emitter, base and resistor apertures.

FIG. 10 illustrates an emitter contact 62 after metal deposition and a strip of metallization 64 which may typically connect the first or base region 34 of the transistor with the adjacent diffused resistor 31. The strip of metallization 64, which may typically be aluminum, is evaporated over the vapor deposited oxide layers 41 and 42. Thus, electrical contact is made between the base region 24 and the diffused resistor 34 while being insulated by oxide layers 41 and 42 from the semiconductor structure therebetween.

It should be understood that the process according to the present invention is not limited to the fabrication of bipolar transistors. This process may also be used, for example, to fabricate junction field-effect transistors. In the fabrication of a junction field-effect transistor corresponding to the bipolar transistor structure previously described, the first or base region 24 of the bipolar transistor would typically correspond in geometry to the channel region of the junction field-effect transistor. Similarly, the second or emitter region 46 of the bipolar transistor previously described would correspond to the top gate region of a junction field-effect transistor. Obviously, the metallization pattern would be different for the junction field-effect transistor since the first region 24 of the junction FET would require two contacts for the source and drain, respectively, at each end of the channel. However, these modifications are obvious to those skilled in the art.

Additionally, the masking steps which have been described included the use of photoresist to form desired oxide patterns on the semiconductor surface. One photoresist material is sold under the name of KMER by the Kodak Company. However, various other oxide masking materials may be used to pattern the oxide masks within the scope of the present invention.

Finally, the diffusion masks of the present invention which are used to limit the lateral extent of the impurities introduced into the semiconductor body are not necessarily limited to oxides. Various nitrides and phosphorus doped glasses such as phosphorus silicate can be used for impurity masks within the scope of the present invention.

While the invention has been particularly shown and described with reference to preferred embodiments thereof, it will be understood bf those skilled in the art that the foregoing and other changes in form and details may be made therein without departing from the spirit and scope of the invention.

What is claimed is:

1. In a process for fabricating a semiconductor structure a method for forming a resistive region having a predetermined value of resistance per square within the structure by first establishing an initial value of resistance per square and by employing additional processing steps for maintaining the resistance per square within a predetermined desirable level which includes the steps of:

providing a body of semiconductor material of one conductivity type having an upper surface;

forming a first mask on said upper surface and having an opening therethrough exposing a portion of said upper surface in which a resistive region is to be formed;

forming a second conductivity type region in said body through said opening, said region having an initial value of resistance per square defined by selectively diffusing a conductivity type determining impurity through said opening and into said region to establish an impurity concentration lying within the range of $5\times10^{19}$ atoms/cc. to $5\times10^{20}$ atoms/cc.;

reforming a second mask at least over said exposed portion of said upper surface through vapor deposition using a temperature range of 350° C. and 500° C. for maintaining the resistance per square substantially within the range originally established; and annealing said second mask at a temperature over 900° C. for a time such that the said concentration of impurities in said second region remain within the range of $3\times10^{19}$ atoms/cc. to $3\times10^{20}$ atoms/cc. and said second mask is densified.

2. A process for fabricating a semiconductor structure as recited in claim 1, wherein said step of reforming said second mask further includes:

forming a first layer of silicon dioxide at temperatures ranging from between 425° C. to 450° C.; and forming a phosphorus doped second layer of silicon dioxide at temperatures ranging from between 425° C. to 450° C.

3. A process for fabricating a semiconductor structure as recited in claim 1, wherein:

said conductivity type determining impurity is boron.

4. A process for fabricating a semiconductor structure as recited in claim 1, wherein:

said second conductivity type region forms a resistive element having an impurity concentration of approximately $1\times10^{20}$ atoms/ cc. impurity.

5. A process for fabricating a semiconductor structure as recited in claim 1, wherein said step of annealing comprises:

annealing said second mask at a temperature of approximately 975° C. for approximately twenty (20) minutes whereby, said concentration of impurities in said second region remain within the range of $3\times10^{19}$ atoms/cc. to $3\times10^{20}$ atoms/cc. and said second mask is densified.

6. A process for fabricating a semiconductor structure which includes the steps of:

providing a body of semiconductor material of one conductivity type having an upper surface;

forming a first mask on said upper surface and having a first opening therethrough exposing a portion of said upper surface;

forming a first region of second conductivity type in said body through said opening by selectively diffusing a conductivity type determining impurity through said opening and forming an area having an impurity concentration higher than $1\times10^{19}$ atoms/cc. and automatically reforming a second mask on said upper surface including said exposed surface;

forming a second opening through said first mask and said second mask and exposing a second portion of said upper surface;

forming a second region of second conductivity type in said body through said second opening by selectively diffusing a conductivity type determining impurity through said second opening and forming a second area having an impurity concentration between the range of $5\times10^{19}$ atoms/cc. to $5\times10^{20}$ atoms/cc. and automatically reforming a third mask on said second mask and said second portion;

removing said first, second and third masks;

cleaning said upper surface for obtaining a positive offset voltage between the range of +1 to 20 volts;

exposing said cleaned upper surface to a solution for chemically absorbing any material left by said step of cleaning selected from the group of acetone, isopropyl alcohol and methyl alcohol;

forming a fourth mask over said upper surface using a temperature range of 425° C. to 450° C. and providing a third opening therethrough for exposing a portion of said first region of second conductivity type;

passing a conductivity type determining impurity through said third opening for forming a third region of said one type conductivity using a temperature range of approximately 975° C. for approximately twenty (20) minutes and automatically forming a thin protective layer over said third region;

selectively removing a first portion of said thin protective layer and a first portion of said fourth mask overlying said second region of second conductivity type for facilitating the making of an electrical ohmic contact thereto; and controllably removing said thin protective layer overlying said third region of said one type conductivity for facilitating the making of an electrical ohmic contact thereto.

7. A process for fabricating a semiconductor structure as recited in claim 6, wherein:

said second region of second conductivity type forms a resistive element having an impurity concentration of approximately $1\times10^{20}$ atoms/cc.

8. A process for fabricating a semiconductor structure as recited in claim 6, wherein:

said absorbing solution is acetone having less than a 5% water content.

9. The process defined in claim 6 wherein:

said semiconductor body is silicon; and the forming of said fourth mask includes vapor depositing a first layer of silicon dioxide on said surface of said semiconductor body after said first region has been formed and said first mask has been completely removed from the surface of said semiconductor body.

10. The process defined in claim 6 which further includes:

vapor depositing a mixed oxide layer comprising silicon dioxide and phosphorus pentoxide on said first layer of silicon dioxide.

11. The process defined in claim 6 wherein the formation of said thin protective layer over said third layer further includes:

growing a thin layer of thermal oxide on the exposed portion of said third region and on the exposed portion of said fourth mask so that subsequently, by controllably etching said thin protective layer, said third region may be exposed for the formation of ohmic contacts thereon, said fourth mask being protected by said thin layer of thermal oxide during the etching of said thermal oxide to expose said third region at the same opening through which the impurity was passed to form said third region, thereby requiring no further masking and etching steps to form an opening for ohmic contact to said third region.

12. The process defined in claim 6 which further includes depositing metallization on the exposed portions of said first, second and third regions to thereby provide an electrical connection to said semiconductor structure.

13. The process defined in claim 6 wherein the removing of said thin protective layer to expose a portion of said third region includes etching said thin protective layer with a dilute hydrofluoric acid solution.

14. The process defined in claim 10 which includes applying a dilute hydrofluoric acid solution comprising approximately 15 parts saturated solution of ammonium fluoride, approximately 1 part 48% hydrofluoric acid, and approximately 4 parts $H_2O$.

References Cited

UNITED STATES PATENTS

| | | | |
|---|---|---|---|
| 3,450,961 | 6/1969 | Tsai | 317—235 |
| 3,481,781 | 12/1969 | Kern | 117—215 |
| 2,948,642 | 8/1960 | MacDonald | 148—1.5 |
| 3,158,505 | 11/1964 | Sandor | 117—215 |
| 3,431,636 | 3/1969 | Granberry et al. | 29—578 |
| 3,490,964 | 1/1970 | Wheeler | 148—187 |
| 3,507,716 | 4/1970 | Nishida et al. | 148—187 |

L. DEWAYNE RUTLEDGE, Primary Examiner

J. M. DAVIS, Assistant Examiner

U.S. Cl. X.R.

148—175; 317—235 R